United States Patent [19]

Amano et al.

[11] Patent Number: 5,496,766
[45] Date of Patent: Mar. 5, 1996

[54] METHOD FOR PRODUCING A LUMINOUS ELEMENT OF III-GROUP NITRIDE

[75] Inventors: Hiroshi Amano; Isamu Akasaki, both of Nagoya; Toshiyuki Tanaka; Teruo Tohma, both of Tsurugashima; Katsuhide Manabe, Nishikasugai, all of Japan

[73] Assignee: Pioneer Electronic Corporation, Tokyo, Japan

[21] Appl. No.: 411,467

[22] Filed: Mar. 28, 1995

[30] Foreign Application Priority Data

Mar. 28, 1994 [JP] Japan .................. 6-057545

[51] Int. Cl.[6] .................................. H01L 21/20
[52] U.S. Cl. .................. 437/127; 437/129; 117/952
[58] Field of Search .......................... 437/127, 129, 437/107; 117/905, 952

[56] References Cited

U.S. PATENT DOCUMENTS

| | | | |
|---|---|---|---|
| 5,247,533 | 9/1993 | Okazaki et al. | 372/45 |
| 5,272,108 | 12/1993 | Kozawa | 437/127 |
| 5,290,393 | 3/1994 | Nakamura | 437/127 |
| 5,306,662 | 4/1994 | Nakamura et al. | 437/107 |
| 5,389,571 | 2/1995 | Takeuchi et al. | 437/133 |

FOREIGN PATENT DOCUMENTS

| | | | |
|---|---|---|---|
| 187597 | 7/1992 | Japan | 117/952 |

OTHER PUBLICATIONS

S. Nakamura et al., "Thermal Annealing Effects on P-Type Mg-Doped GaN Films," Japanese Journal of Applied Physics, vol. 31 (1992) pp. L139–L142.

H. Amano et al., "P-Type Conduction in Mg-Doped GaN Treated with Low-Energy Electron Beam Irradiation (LEEBI)" Japanese Journal of Applied Physics, vol. 28, No. 12, Dec. 1989, pp. L2112–L2114.

Primary Examiner—. Bruce Breneman
Assistant Examiner—Linda J. Fleck
Attorney, Agent, or Firm—Sughrue, Mion, Zinn, Macpeak & Seas

[57] ABSTRACT

Disclosure is a process for producing a luminous element of III-group nitride semiconductor having a crystal layer $(Al_xGa_{1-x})_{1-y}In_yN$ ($0 \leq x \leq 1$, $0 \leq y \leq 1$) to which a II-group element is added, comprising the steps of forming a crystal layer $(Al_xGa_{1-x})_{1-y}In_yN$ ($0 \leq x \leq 1$, $0 \leq y \leq 1$) to which a II-group element is added; irradiating a low energy electron beam onto a topmost surface of the crystal layer to reform only the crystal layer; forming a thin film for absorbing optical energy on the topmost surface of the crystal layer; and pulse-heating the thin film for absorbing optical energy by heating means to reform only the crystal layer, thereby to produce a bluish green, blue or UV light emitting diode or a semiconductor laser diode with a high precision color purity.

4 Claims, 4 Drawing Sheets

5,496,766

METHOD FOR PRODUCING A LUMINOUS ELEMENT OF III-GROUP NITRIDE

BACKGROUND OF THE INVENTION

1. Field of the Invention

The present invention relates to a luminous element such as a light emitting diode, a semiconductor laser diode or the like and, particularly to a process for producing a semiconductor a luminous element or opto-electronic device comprising a crystal layer including a single crystal of III-group nitride semiconductor $(Ga_{1-x}Al_x)_{1-y}In_yN$ to which at least one of II-group elements such as magnesium (Mg), zinc (Zn) or the like is added, which is attracted as a wide gap semiconductor expected to be a material for a device for being capable of emitting a blue light.

2. Description of the Related Art

The III-group nitride crystal made of aluminum (Al), gallium (Ga), indium (In) and nitrogen (N) i.e., $[(Al_xGa_{1-x})_{1-y}In_yN$ ($0 \leq x \leq 1$, $0 \leq y \leq 1$)] to which at least of II-group elements such as Mg, Zn or the like is added is produced by a chemical vapor deposition. This so-called II-group added III-group nitride as it is immediately after growth has a high resistance. In addition, the II-group added III-group nitride does not have a proper emitting property of blue light or ultraviolet (UV) radiation. Therefore, if a blue light emitting diode is produced, there is known as its emitting property being no good.

Recently, a reforming method have been reported that a high resistance $(Al_xGa_{1-x})_{1-y}In_yN$ ($0 \leq x \leq 1$, $0 \leq y \leq 1$) crystal to which Mg or Zn is added is reformed to a low resistance p-type crystal by means of a specific treatment. H. Amano et al. discloses that a low resistance p-type crystal is achieved by performing a low energy electron beam irradiation treatment to such a crystal (H. Amano, M. Kito, K. Hiramatsu and I. Akasaki, Jpn. J. Appl. phys. Vol. 28, 1989, pp-L2112–L2114). Further, S. Nakamura et al. also discloses that a low resistance p-type crystal is achieved by performing a heat treatment under a pressurized or atmospheric pressure in an atmosphere of nitrogen to such a crystal (S. Nakamura, T. Mukai, M. Senoh, N. Iwasa, Jpn. J. Appl. Phys. Vol. 31, 1992, pp-L139–L142).

The low energy electron beam irradiation treatment causes an increase of a blue light emitting intensity of the element and is an excellent reforming-treatment method for achieving a low resistance crystal. However, it causes an unwanted luminescent center increase. As a result, if for instance a blue light emitting diode is produced, the diode emits a yellow light together with a blue light. This mixture emitting is problematic in color purity. This is a reason that the electron beam irradiation activates not only an inactive acceptor impurity as it is grown improving the p-type conductivity but also an yellow luminescent center. A necessary luminescent center and the acceptor impurity are not selectively activated by using the electron beam irradiation in a process for producing a light emitting diode.

On the other hand, a low resistance crystal layer is achieved by a heat treatment in an atmosphere of nitrogen. However, this heat treatment activate the acceptor impurity originating the p-type conductivity, and the increase of intensity of blue light emission from the resultant element is inferior to that reformed by the electron beam irradiation. Therefore, this heat treatment is problematic. In addition, a common heat treatment generally heats a growth layer. Since a time period for heating the crystal is long, the rising time and descending time in temperature can not be ignored in the heating treatment. The mutual diffusion of major elements and acceptor impurities between the grown layers is likely to occur in the element. This mutual diffusion is particularly problematic to a bluish green, blue or UV light emitting diode or a semiconductor laser diode each necessitating a steep interface between the adjacent grown layers.

SUMMARY OF THE INVENTION

It is therefore an object of the present invention is to provide a process for producing a bluish green, blue or UV light emitting diode or a semiconductor laser diode with a high precision, in which the mutual diffusion of the acceptor impurity in the grown layers is suppressed and, the activation of any luminescent center other than a desired luminescent center is restrained.

A process for producing a luminous element of III-group nitride semiconductor having a crystal layer $(Al_xGa_{1-x})_{1-y}In_yN$ ($0 \leq x \leq 1$, $0 \leq y \leq 1$) to which a II-group element is added according to the present invention, which comprises the steps of;

forming a crystal layer $(Al_xGa_{1-x})_{1-y}In_yN$ ($0 \leq x \leq 1$, $0 \leq y \leq 1$) to which a II-group element is added;

irradiating a low energy electron beam onto a topmost surface of said crystal layer to reform only said crystal layer;

forming a thin film for absorbing optical energy on said topmost surface of said crystal layer; and pulse-heating said thin film for absorbing optical energy by heating means to reform only said crystal layer.

According to the present invention, (1) said surface pulse-heat treatment step heats only a semiconductor III-group nitride crystal layer including an acceptor impurity of II-group such as Mg, Zn or the like without heating the other layer to restrain the mutual diffusion in the grown layers and further, (2) said low energy electron beam irradiation treatment step suppresses an additional activation of other than luminescent centers for blue and UV light emissions. Therefore, a bluish green, blue or UV light emitting diode or a semiconductor laser diode with a high precision is obtained by the present invention.

DETAILED DESCRIPTION OF THE PREFERRED EMBODIMENTS

The present inventors have completed the present invention based on the results of studies of various methods for treating the surface of a III-group nitride semiconductor crystal in order to acquire on a sapphire substrate a $(Ga_{1-x}Al_x)_{1-y}In_yN$ single crystal with a high emitting property and low resistance to which an acceptor impurity of II-group element such as Mg, Zn or the like is doped, by using a chemical vapor deposition method, particularly a metalorganic compound chemical vapor deposition method (MOCVD) in which a metalorganic compound gas is used as a material.

A method of forming a light emitting diode with a single hetero structure comprising a single crystal of $(Ga_{1-x}Al_x)_{1-y}In_yN$ ($0 \leq x \leq 1$, $0 \leq y \leq 1$) on a sapphire substrate in accordance with a preferred embodiment of the present invention will be described hereinafter. It is to be noted that the embodiment and examples to be described below simply illustrates the invention, and the invention is not limited thereto.

Figure 1:
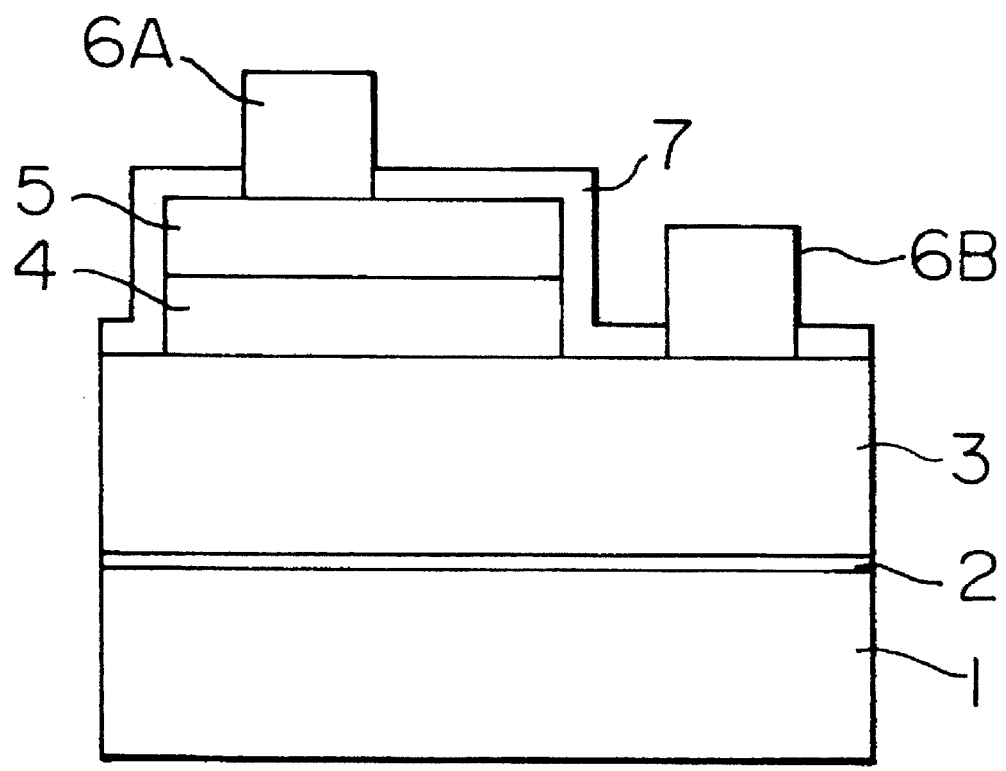
FIG. 1 is a schematic constructive cross-sectional view illustrating a GaN blue light emitting diode of pn-junction-type having a III-group nitride semiconductor to which a II-group element added manufactured by an embodiment according to the present invention.

A light emitting diode in the embodiment comprises, as shown in FIG. 1, a sapphire substrate 1, a buffer layer 2 of AlN, a Si-doped n-type GaN layer 3, a Si-doped n-type GaN guide layer 4, a Mg-doped GaN layer 5 and electrodes 6A, 6B in which a polyimide protective layer 7 protects of the surface over the whole except the electrodes.

The embodiment employs a metalorganic compound chemical vapor deposition apparatus which is excellent in term of control of film thickness. Those layers are formed by this apparatus. First, a sapphire substrate 1 is prepared. Since there is a difference 10% or more in lattice constant between sapphire and a $(Ga_{1-x}Al_x)_{1-y}In_yN$ ($0 \leq x \leq 1$, $0 \leq y \leq 1$) crystal, an AlN buffer layer 2 is deposit 50 nm in thickness on the sapphire substrate at a low temperature 600° C. or less and then, a $(Ga_{1-x}Al_x)_{1-y}In_yN$ ($0 \leq x \leq 1$, $0 \leq y \leq 1$) crystal, for instance a Si-doped n-type GaN layer 3 is epitaxial-grown on the buffer layer to form a low resistance epitaxial substrate.

After that, a Si-doped n-type GaN layer 4 is selectively grown. Subsequently, a Mg-doped GaN layer 5 is grown on the applied n-type GaN layer 4. After the temperature lowers the resultant sapphire wafer substrate is taken out of the reactor of the growth apparatus. A low energy electron beam is irradiated onto a topmost surface of the Mg-doped GaN layer 5 of the substrate. Subsequently, a thin metal film such as chromium (Cr) or the like absorbing optical energy is formed on the topmost surface of the Mg-doped GaN layer 5 of the substrate. After that, the surface pulse-heat treatment is performed using an infrared (IR) radiation lamp or the like of an IR radiation irradiating apparatus in which IR radiation is irradiated onto a topmost surface of the Mg-doped GaN layer 5 of the substrate.

Subsequently, metal electrodes 6A, 6B such as Au or the like are selectively vapor-deposited on the Si-doped n-type GaN layer 3 and the Mg-doped p-type GaN region 5 respectively and then a polyimide protective layer 7 is selectively formed thereon. As shown in FIG. 1, the light emitting diode is obtained. It is confirmed that when a bias is applied to the diode between the n-type GaN layer 3 as the negative side and the Mg-doped p-type GaN region 5 as the positive side, a bluish violet light is emitted at room temperature.

In this way, a bluish green, blue and UV light emitting diode or a blue and UV semiconductor laser diode with a very high luminance may be manufactured by the embodiment of the process for producing a luminous element of III-group nitride semiconductor having a crystal layer $(Al_xGa_{1-x})_{1-y}In_yN$ ($0 \leq x \leq 1$, $0 \leq y \leq 1$) to which a II-group element such as Mg, Zn or the like is doped. Namely, this is because the embodiment comprises a combination of both the treatments of;

the surface pulse-heating treatment of forming a thin film for absorbing optical energy on the topmost surface of the crystal layer and then, pulse-heating the thin film for absorbing optical energy in such a manner that a light source of heating means irradiates light for instance IR radiation onto the absorbing thin layer at a short time period to reform only the surface of crystal layer $(Al_xGa_{1-x})_{1-y}In_yN$ ($0 \leq x \leq 1$, $0 \leq y \leq 1$) to which a II-group element is added within the short time period; and the low energy electron beam irradiation treatment of irradiating an electron beam with a fine spot diameter onto a topmost surface of the crystal layer $(Al_xGa_{1-x})_{1-y}In_yN$ ($0 \leq x \leq 1$, $0 \leq y \leq 1$) to which a II-group element is added in order to reform partially the crystal layer.

Concrete experiments of a light emitting diode manufactured by using the low energy electron beam irradiation treatment and the surface pulse-heat treatment were preformed. The procedure of such experiments will be described in detail hereinafter.

(Low energy electron beam irradiation treatment)

Figure 2A:
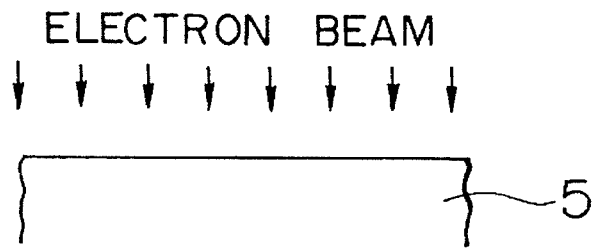
FIGS. 2A–2E are schematic constructive and partially enlarged cross-sectional views each showing a Mg-doped GaN layer used for a GaN blue light emitting diode of pn-junction-type having a III-group nitride semiconductor to which a II-group element added during the low energy electron beam irradiation treatment step and the surface pulse-heat treatment step in an embodiment according to the present invention.

As shown in FIG. 2A, a low energy electron beam emitted from a high luminance electron gun was irradiating onto a topmost surface of a Mg-added GaN layer 5 formed through a MOCVD method, under the conditions shown in Table 1 below. The Mg-added GaN layer of this sample was of a very high resistance as it was grown after the MOCVD growth. Such a sample was reformed by a low energy electron beam irradiation treatment to a low resistance p-type crystal which had a resistivity 0.2 Ωcm and a positive-hole density $2 \times 10^{18}$ cm$^{-3}$ at room temperature. The conditions of the low energy electron beam irradiation treatment were as follows: An acceleration voltage of a range of 5 KV–25 KV was preferable for the electron gun, since a low voltage less than this range was not effective and that sample was damaged by a high voltage acceleration more than this range. The spot diameter on the surface of less than 1 μm was preferable for the electron beam, since a sufficient reforming effect was not obtained when a very low current density occurred due to a larger spot than such a spot diameter. The electrical current in the sample was in a range of 1 nA–300 nA preferably, since a low current less than this range was not effective and the emitting property of the sample was lowered by a high current application more than this range. The irradiating time period per one spot is in a range of 0.5 μseconds–300 μseconds preferably.

When an irradiating time period was shorter than this range then any sufficient effect was not obtained. But, for an actual irradiating step of the electron beam, a time period proceeding to 100 μseconds may be too long. The carrying too far of electron irradiating is not actual. The temperature range of the sample is in 4.2K–700 K preferably. The treatment at a low temperature is sufficient and effective, but a treatment at a higher temperature than this range was not preferable since it caused the elimination of nitrogen from the Mg-added GaN layer because of vacuum in the treatment chamber of the electron beam irradiation apparatus.

TABLE 1

| Conditions for Low energy electron beam irradiation | |
|---|---|
| Acceleration voltage: | 20.06 KV |
| Spot diameter: | 10 nm |
| Current in the Sample: | 50 nA |
| Irradiating time period per one spot: | 10 μseconds |
| Temperature of the Sample: | 300 K |

(Surface pulse-heat treatment)

Figure 2B:
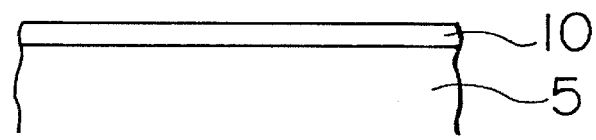

Next, as shown in FIG. 2B, a first thin metal film 10 of gold (Au) or Mg for peeling a second thin film afterwards described and providing an interface reaction between the GaN layer and the second thin film was vacuum-vapor-deposited with 0.05 μm in thickness by a rheostatic heating method on the surface of the Mg-added GaN layer 5 treated by the low energy electron beam irradiation treatment.

Figure 2C:
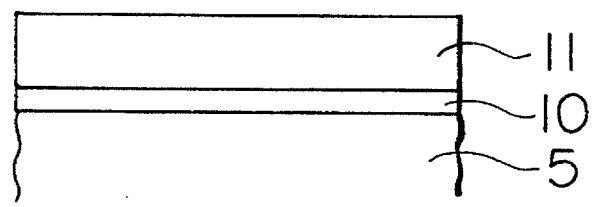

After that, as shown in FIG. 2C, a chromium (Cr) layer 11 was vapor-deposited with 0.3 μm in thickness as the second thin film or an absorption layer for absorbing IR radiation from an IR radiation lamp on the first thin metal film 10. When the IR radiation absorption layer 11 was formed with more than 0.5 mm, it is difficult to achieve a steep rising of temperature and only heating of the surface of the Mg-added GaN layer 5 in the sample. Therefore, the thickness of the second thin metal film is in 0.5 mm or less preferably.

Figure 2D:
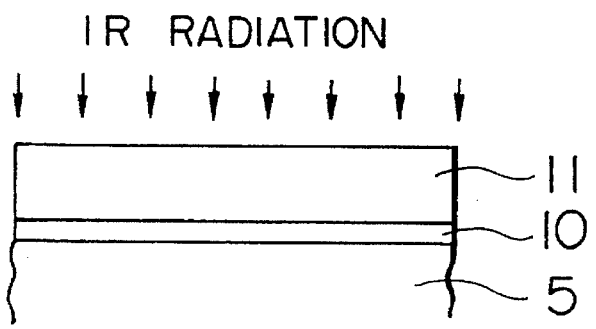

Subsequently, the resultant sample was introduced into a heating furnace of a quartz tube. After the furnace was evacuated, the sample was kept in vacuum or an atmosphere of an inactive gas and then, as shown in FIG. 2D, IR radiation emitted from an IR radiation lamp was irradiated to the sample so as to heat rapidly the Cr layer 11 as a surface pulse-heat treatment. The time period for rising up to a predetermined treatment temperature was about 0.5 seconds. The control of temperature was conducted by using a rheostatic current control to the IR radiation lamp. The temperature of the Cr layer 11 was measured with a radiation pyrometer.

After the temperature of the sample was reached at the predetermined treatment temperature, the sample was kept at such a temperature for a predetermined time period. The kept time period is set according to the treatment temperature and the size of the sample. For instance, when using and treating a sample of a sapphire substrate wafer with 1 cm square and 0.25 mm in thickness and a sample temperature is set at 1140° C., the sample is kept for 60 seconds. Further, in case of a sample temperature 1000° C. with the same wafer, the sample is kept for 120 seconds properly. The treatable depth from the sample surface is determined according to the Cr layer 11 deposited on the film 11. For instance when a sample is GaN and a thickness of the Cr layer is 0.3 μm, then the surface of GaN is heat-treated within a depth of about 0.2 μm. The treatment temperature is in a range of 700°–1200° C. in the absorption layer 11 preferably.

After that, the current supply to the IR radiation lamp was stopped and then, the sample was cooled at room temperature. The time period proceeding from the predetermined treatment temperature to the room temperature was about 5 seconds. Each of rising and falling temperature gradient was 30° C./sec. or more at the start and end of treatment preferably, since there was obtained an difference of advantageous effects between a pulse-heat treatment and a conventional one by using a gentle gradient less than the gradient 30° C./sec. The falling time period of temperature is determined according to the time constant of the used IR radiation lamp. Therefore, a mechanism such as a shutter or the like for rapidly shielding IR radiation may be used for achieving a further shorter time period of the pulse-heat irradiating treatment.

In addition, a single or more heat pulses may be used in the pulse-heat treatment. For instance, a pulse-heat treatment in which a heat pulse at 1140° C. for 30 seconds is repeated at two times is equivalent in efficiency to a 1140° C., 60 seconds of heat treatment once.

Figure 2E:
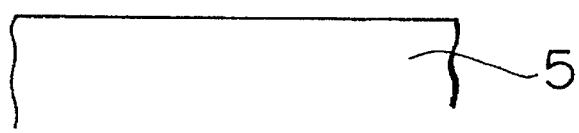

Finally, after the resultant sample is taken out of the heating furnace, the gold or Mg layer 10 and the Cr layer 11 of the sample was removed by using the aqua regia as shown in FIG. 2E.

(Evaluation of Low energy electron beam irradiation treatment and Surface pulse-heat treatment)

Figure 3:
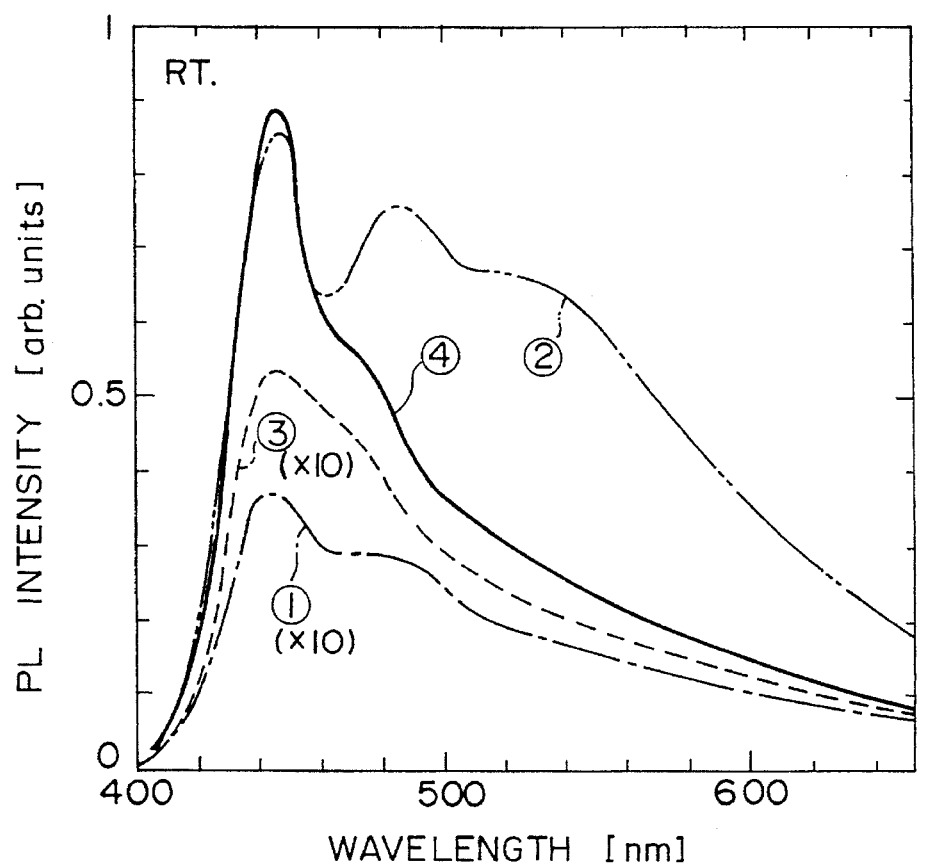
FIG. 3 is a graph showing photo-luminescence (PL) spectral properties of intensity of PL v.s. wavelength of emission in samples of light emitting diodes, in which curve ① representing a sample as it is grown, curve ② representing a sample treated by a low energy electron beam irradiation, curve ③ representing a sample treated by a surface pulse-heating, and curve ④ a sample treated by both the low energy electron beam irradiation treatment and the surface pulse-heating.

FIG. 3 shows photo-luminescence spectral properties. Curve ① denotes a change of PL intensity to wavelength emitted from a sample of light emitting diode having the Mg-added GaN layer 5 as it is grown without any treatment. Curve ② denotes a change of PL intensity to wavelength emitted from a sample of light emitting diode having the Mg-added GaN layer 5 subjected to only the low energy electron beam irradiation treatment. Curve ③ denotes a change of PL intensity to wavelength emitted from a sample of light emitting diode having the Mg-added GaN layer 5 subjected to only the surface pulse-heat treatment. Curve ④ denotes a change of PL intensity to wavelength emitted from a sample of light emitting diode having the Mg-added GaN layer 5 subjected to both the low energy electron beam irradiation treatment and the surface pulse-heat treatment.

With comparison with the curved lines ① and ②, it is understood that the PL intensity in a blue light and yellow light emission (500–600 nm) of the sample subjected to only the low energy electron beam irradiation treatment is increased higher by two figures than that of without any treatment, although curved line ① is plotted by expanded to ten times as great as real values measured.

As seem from the curved line ③, the PL intensity of the sample subjected to only the surface pulse-heat treatment is insufficient, although curved line ③ is plotted by expanded to ten times as great as real values measured.

As seem from the curved line ④ in the sample subjected to the combination of both the low energy electron beam irradiation treatment and the surface pulse-heat treatment, a yellow light emission is compressed and only a blue light emission is kept at the intensity in the low energy electron beam irradiation treatment.

It is apparent from FIG. 3 that the sample subjected to the combination of both the low energy electron beam irradiation treatment and the surface pulse-heat treatment has the best emitting property.

In addition, the sample subjected to the combination of both the low energy electron beam irradiation treatment and the surface pulse-heat treatment is of p-type conductivity and has a resistivity 0.2 Ω.cm and a positive-hole density $2 \times 10^{18}$ cm$^{-3}$.

Figure 4:
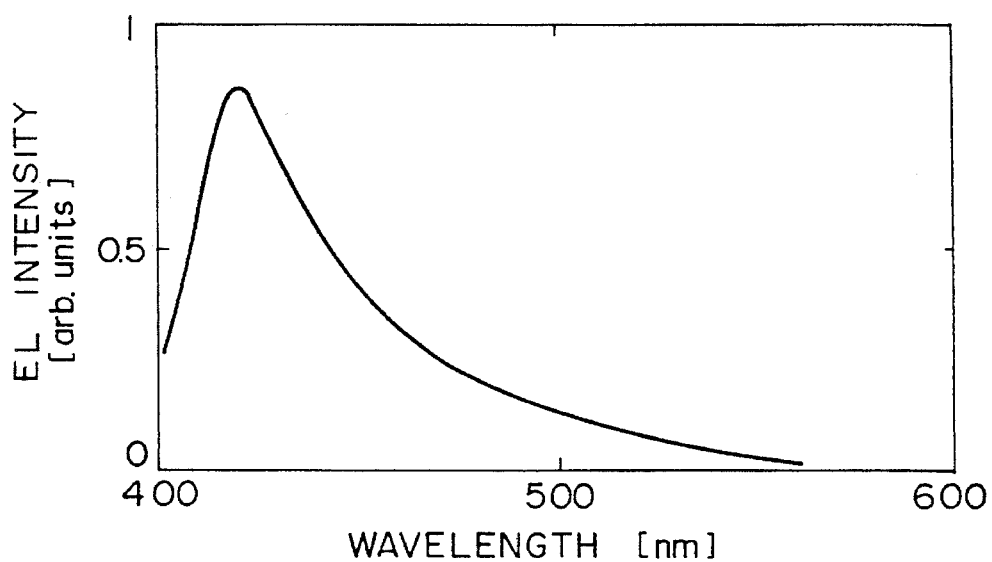
FIG. 4 is a graph showing electroluminescence (EL) spectral property of intensity of EL v.s. wavelength of emission in a pn-junction-type GaN blue light emitting diode manufactured by using the combination of the low energy electron beam irradiation treatment and the surface pulse-heat treatment according to the present invention.

There was subjected to an emitting test in the light emitting diode as shown in FIG. 1 comprising the Si-added n-type GaN layer 4 and the Mg-added GaN layer 5 subjected to the above mentioned low energy electron beam irradiation treatment and the surface pulse-heat treatment. Upon application of current across the electrodes of the light emitting diode, only a blue light emitted with a peak of wavelength 420 nm as shown in FIG. 4.

Figure 5:
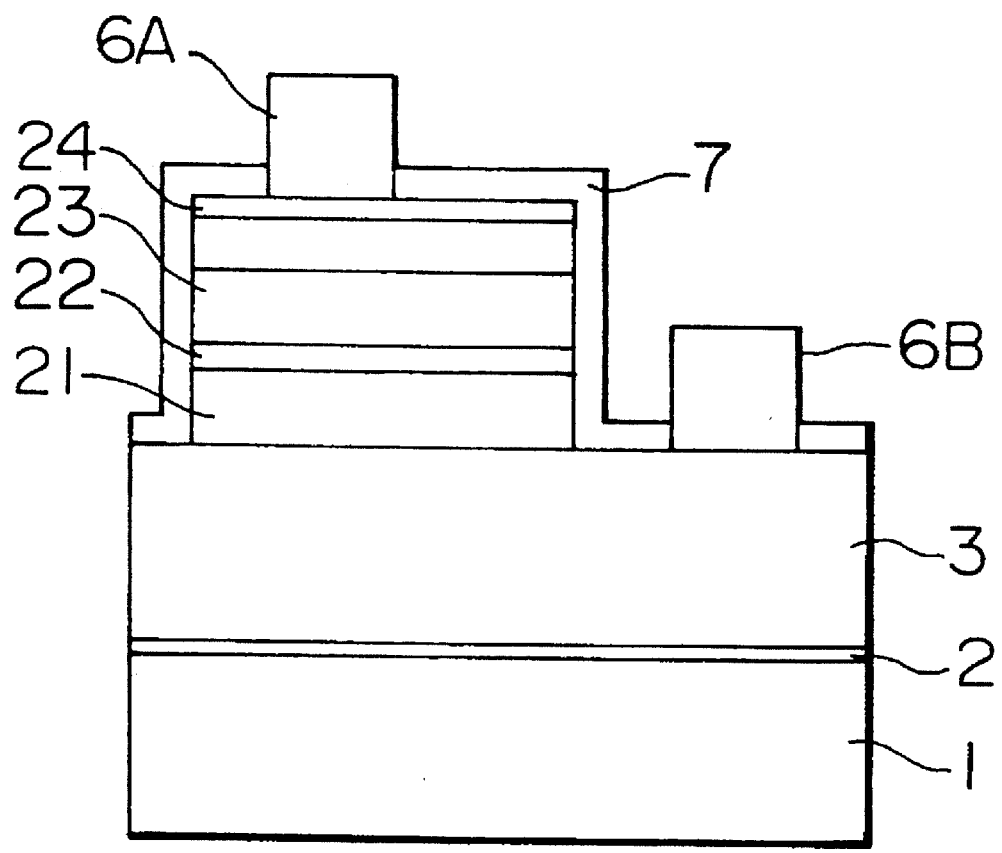
FIG. 5 is a schematic constructive cross-sectional view showing another embodiment of an AlGaN/InGaN semiconductor laser diode of double-hetero junction-type manufactured by using the combination of the low energy electron beam irradiation treatment and the surface pulse-heat treatment according to the present invention the present invention.

Another embodiment of a semiconductor laser diode as shown in FIG. 5 was manufactured by using the MOCVD apparatus in the similar way to the first embodiment. A Si-added n-type AlGaN layer 21 was epitaxial-grown on a Si-doped n-type GaN layer 3 of an epitaxial substrate and then, an undoped GaInN active layer 22 was formed with 10 nm in thickness on the Si-added n-type AlGaN layer 21 and then, a Mg-added AlGaN layer 23 was formed on the active layer and then, a Mg-added GaN layer 24 was formed on the Mg-added AlGaN layer 23. The Mg-added GaN layer 24 was subjected to the low energy electron beam irradiation treatment and the surface pulse-heat treatment. Similarly to the first an embodiment, Electrodes 6A, 6B were formed on the resultant topmost surface of the layer 24, so that a double hetero junction-type semiconductor laser diode was obtained. Upon current-application to this diode, induced emission at wavelength 402.5 nm was observed at room temperature and a bluish violet emission is obtained at a high color purity.

As described above, the present invention of the process for producing a luminous element of III-group nitride semiconductor having a crystal layer $(Al_xGa_{1-x})_{1-y}In_yN$ ($0 \leq x \leq 1$, $0 \leq y \leq 1$) to which a II-group element is added, is characterized in that the precess comprises; the step of forming a crystal layer $(Al_xGa_{1-x})_{1-y}In_yN$ ($0 \leq x \leq 1$, $0 \leq y \leq 1$) to which a II-group element is added; the step of irradiating a low energy electron beam onto a topmost surface of the crystal layer to reform only the crystal layer; the step of forming a thin film for absorbing optical energy on the topmost surface of the crystal layer; and the step of pulse-heating the thin film for absorbing optical energy by heating means to reform only the crystal layer. Therefore, the present invention is capable of producing a bluish green, blue or UV light emitting diode or a semiconductor laser diode with a high precision color purity.

What is claimed is:

1. A process for producing a luminous element of III-group nitride semiconductor having a crystal layer $(Al_xGa_{1-x})_{1-y}In_yN$ ($0 \leq x \leq 1$, $0 \leq y \leq 1$) to which a II-group element is added, comprising the steps of;

forming a crystal layer $(Al_xGa_{1-x})_{1-y}In_yN$ ($0 \leq x \leq 1$, $0 \leq y \leq 1$) to which a II-group element is added;

irradiating a low energy electron beam onto a topmost surface of said crystal layer to reform only said crystal layer;

forming a thin film for absorbing optical energy on said topmost surface of said crystal layer; and pulse-heating said thin film for absorbing optical energy by heating means to reform only said crystal layer.

2. A process according to claim 1, wherein the heating means includes an IR radiation irradiating apparatus.

3. A process according to claim 1, where an absorption thin film with 0.5 mm or less in thickness is used in said surface pulse-heat treatment step.

4. A process according to claim 1, where an absorption thin film is kept at a temperature range of 700°–1200° C. therein in said surface pulse-heat treatment step.

* * * * *

UNITED STATES PATENT AND TRADEMARK OFFICE
CERTIFICATE OF CORRECTION

PATENT NO. : 5,496,766
DATED : March 5, 1996
INVENTOR(S) : Hiroshi AMANO et al.

It is certified that error appears in the above-identified patent and that said Letters Patent is hereby corrected as shown below:

Cover Page, Assignee [73], should read as follows:

PIONEER ELECTRONIC CORPORATION, Tokyo, Japan;
Hiroshi AMANO, Aichi-ken, Japan;
Isamu AKASAKI, Aichi-ken, Japan; and
TOYODA GOSEI CO., LTD., Aichi-ken, Japan.

Signed and Sealed this

Twenty-fifth Day of March, 1997

*Attest:*

BRUCE LEHMAN

*Attesting Officer*  Commissioner of Patents and Trademarks